(12) United States Patent
Nakamura et al.

(10) Patent No.: US 7,661,191 B2
(45) Date of Patent: Feb. 16, 2010

(54) MULTILAYER SUBSTRATE MANUFACTURING METHOD

(75) Inventors: Takeshi Nakamura, Gunma (JP); Katsumi Ito, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 135 days.

(21) Appl. No.: 10/598,469

(22) PCT Filed: Feb. 24, 2005

(86) PCT No.: PCT/JP2005/003562

§ 371 (c)(1),
(2), (4) Date: May 17, 2007

(87) PCT Pub. No.: WO2005/086553

PCT Pub. Date: Sep. 15, 2005

(65) Prior Publication Data

US 2007/0281459 A1      Dec. 6, 2007

(30) Foreign Application Priority Data

Mar. 3, 2004  (JP)  .............................. 2004-059267

(51) Int. Cl.
  *H01K 3/10*  (2006.01)
(52) U.S. Cl. .............................. 29/852; 29/825; 29/830; 29/846; 29/847; 174/255; 174/264; 438/126

(58) Field of Classification Search ........... 29/830–836, 29/846–852, 874, 882; 174/255, 264; 438/107, 438/126; 257/773–778
See application file for complete search history.

(56) References Cited

U.S. PATENT DOCUMENTS

| 6,664,138 B2 * | 12/2003 | Igarashi et al. ............... 438/126 |
| 6,883,231 B2 * | 4/2005 | Igarashi et al. ................ 29/840 |
| 6,889,428 B2 * | 5/2005 | Igarashi et al. ................ 29/832 |
| 7,498,205 B2 * | 3/2009 | Jung et al. ................... 438/126 |

FOREIGN PATENT DOCUMENTS

| JP | 08-153976 | 6/1996 |
| JP | 2002-290044 | 10/2002 |
| JP | 2002-329964 | 11/2002 |
| JP | 2003-318535 | 11/2003 |
| JP | 2003-324263 | 11/2003 |

* cited by examiner

*Primary Examiner*—Minh Trinh
(74) *Attorney, Agent, or Firm*—Fish & Richardson P.C.

(57) ABSTRACT

A manufacturing method of a multilayer substrate that suppresses relative displacement of layers and forms interconnecting portions electrically connecting layers having an accurate positioning. A manufacturing method of a multilayer substrate for laminating, via an insulating film, a wiring layer formed by patterning a conductive film comprises providing a positioning hole in a conductive film laminated at the beginning and patterning a second and/or any subsequent wiring layers after identifying a position of an identification section. Interconnecting sections for interconnecting wiring layers are formed using the identification section.

15 Claims, 9 Drawing Sheets

PRIOR ART

MULTILAYER SUBSTRATE MANUFACTURING METHOD

Priority is claimed to Japanese Patent Application Number JP2004-059267 filed on Mar. 3, 2004, the disclosure of which is incorporated herein by reference in its entirety.

BACKGROUND OF THE INVENTION

1. Field of the Invention

The present invention relates to a manufacturing method of a multilayer substrate, more particularly, to a manufacturing method of a multilayer substrate enabling improvement of positioning accuracy of wiring layers.

2. Description of the Related Art

With the development of high-performance and compact electronic equipment, multilayer wiring structures are more increasingly used in the mounting substrate housed inside electronic equipment. A conventional manufacturing method of a multilayer wiring substrate is hereinafter described with reference to FIG. 9.

First, a first conductive foil 101A and a second conductive foil 101B are attached to a front surface and respectively, to a rear surface of a substrate 100 comprising insulating material such as resin, etc., as illustrated in FIG. 9A.

Next, a process of selectively etching the first conductive foil 101A and the second conductive foil 101B is carried out to form a first wiring layer 102A and a second wiring layer 102B, as shown in FIG. 9B. The wiring layers are laminated via an insulating layer 103A so that a multilayer wiring structure shown in FIG. 9C is obtained. Here, an interconnecting portion 104 is a region for electrically connecting wiring layers.

In the above-described method, deviations in the positioning of the wiring layers occur and it is difficult to form an interconnecting portion 104 connecting similar layers with a high degree of accuracy. Nowadays, demands for compact and high-performance devices are steadily increasing, patterns become increasingly minute requiring accurate interconnection portions connecting layers and accurate positioning of the wiring layers.

SUMMARY OF THE INVENTION

The present invention has been made in view of the above-mentioned problems in the related art and a principal aspect thereof is to provide a manufacturing method of a multilayer substrate that suppresses relative displacement of layers and forms interconnecting portions electrically connecting layers having an accurate positioning.

According to some preferred embodiments of the invention, a manufacturing method of a multilayer substrate which comprises a plurality of wiring layers formed of wiring and/or electrodes formed via insulating material includes providing a positioning section in a first wiring layer and using the positioning section in the first layer as a reference for patterning when forming a second wiring layer and/or any subsequent wiring layers.

Furthermore, according to some embodiments of the invention, a manufacturing method of a multilayer substrate including a plurality of insulated wiring layers formed of wiring and/or electrodes on both surfaces of a core made of insulating material comprises providing a positioning section in a wiring layer formed at least on a surface of the core and using the positioning section in the first layer as a reference for patterning when forming a second and/or any subsequent wiring layers.

Furthermore, according to some embodiments of the invention, a manufacturing method of a multilayer substrate including a plurality of insulated wiring layers formed of wiring and/or electrodes on both surfaces of a core made of a sheet-like insulating material comprises providing a positioning section penetrating the core perpendicularly and including one portion of the first wiring layer formed on both surfaces of the core and using the positioning section in the first layer as a reference for patterning when forming a second and/or any subsequent wiring layers.

With a manufacturing method of a multilayer substrate according to some embodiments of the invention, when using the positioning section as a reference, the insulating material and the wiring layer formed in the upper layer of the positioning section are removed.

With a manufacturing method of a multilayer substrate according to some embodiments of the invention, the positioning section has a cylindrical shape when seen from above.

With a manufacturing method of a multilayer substrate according to some embodiments of the invention, the position of the wiring layer used as reference can be identified by the use of X-rays.

A manufacturing method of a multilayer substrate according to some embodiments of the invention comprises preparing a sheet comprising a first conductive film laminated on both surfaces of a first insulating film forming a core; forming a cylindrical positioning hole that penetrates the sheet; etching the both of the first conductive film at locations corresponding to a first interconnection portion by using the positioning hole as a reference to provide a first through-hole by removing the exposed first insulating layer; forming a conductive coating in the first through-hole and on the first conductive film; patterning the first conductive film using the positioning hole as reference to form a first wiring layer; forming a second conductive film on both surfaces of the sheet via a second insulating film; exposing the positioning hole and etching the second conductive film at locations corresponding to a second interconnecting portion to form a second through-hole by removing the exposed second insulating film; forming a conductive coating in the second through-hole and on the second conductive film; patterning the second conductive film by using the positioning hole as a reference to form a second wiring layer.

In a manufacturing method of a multilayer substrate according to some embodiments of the invention, the positioning hole positioned under the second conductive film can be identified by the use of X-rays.

In a manufacturing method of a multilayer substrate according to some embodiments of the invention, the first wiring layer forming the positioning hole is provided in a periphery of an opening and has a sword guard shape so that when a laser beam is irradiated onto inner walls of the sword guard-shaped first wiring layer, the second insulating film is removed.

According to the manufacturing method of a multilayer substrate of some embodiments of the invention, the position of the positioning section provided in a conductive film formed at the beginning is identified to carry out patterning of a second and/or any subsequent films. Thus, even in case a plurality of wiring layers are formed, position identification is carried out by one of the positioning sections formed at the beginning so that accuracy of the relative positioning of layers can be improved. Moreover, patterning of the interconnecting portion connecting wiring layers is carried out after identifying the position of the positioning section. It is thus possible to improve positioning accuracy at locations where interconnecting portions are formed.

According to the manufacturing method of a multilayer substrate of some embodiments of the invention, positioning holes penetrating a laminated sheet formed of conductive films attached to both surfaces of an insulating film are provided to assist alignment in subsequent processes. Accordingly, even in case a wiring layer is laminated on both sides of a laminated sheet, both wiring layers are aligned using the same positioning holes, so that the positioning accuracy of the wiring layers can be improved. Moreover, formation of the interconnecting portion electrically connecting wiring layers is carried out after position of the positioning holes is identified so that positioning accuracy thereof can further be improved.

DETAILED DESCRIPTION OF THE EMBODIMENTS

Figure 1A:
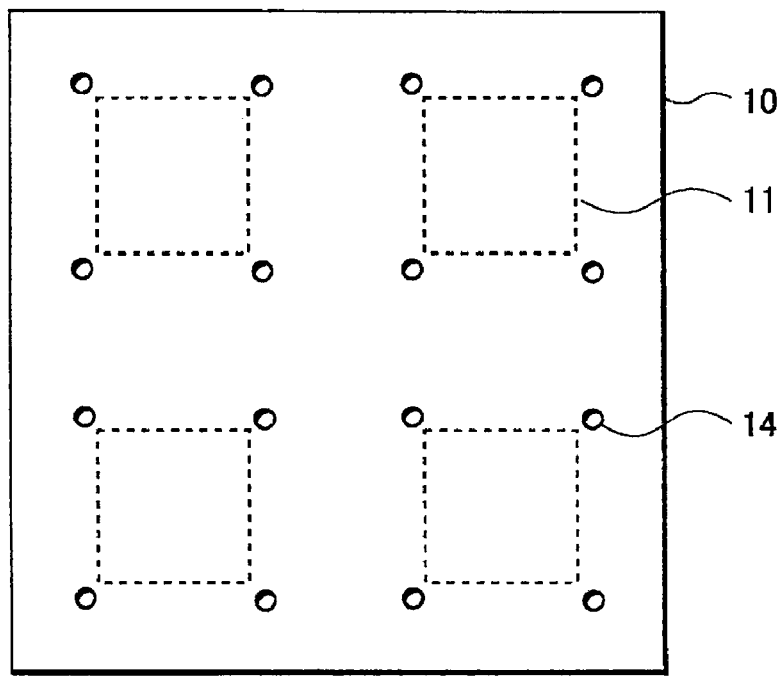
FIG. 1A is a planar view and FIG. 1B to FIG. 1F are cross-sectional views showing a manufacturing method of a multilayer substrate of embodiments of the present invention.

A manufacturing method of a multilayer substrate according to some preferred embodiments is described with reference to several figures. In the present embodiment, multilayer wiring indicate a wiring structure having two or more layers and corresponds to a substrate comprising multilayer wiring or a multilayer substrate, etc. mounting a circuit device for a package.

In the manufacturing method of this preferred embodiment, the multilayer substrate to be manufactured comprises a wiring layer 18 formed by patterning a conductive film 13 and laminated via an insulating film 12 and after providing positioning holes 14 in the conductive film 13 laminated at the beginning and identifying the positioning thereof, the second and/or any subsequent wiring layers 18 is/are patterned. Here, an interconnection portion 16 connecting wiring layers can be formed using the positioning hole (positioning section).

FIG. 1 shows the process of forming positioning holes 14 in a laminated sheet 10. FIG. 1A is a plain view of a laminated sheet and FIG. 1B to FIG. 1F are cross-sectional views of the laminated sheet 10 of this embodiment.

Figure 1B:
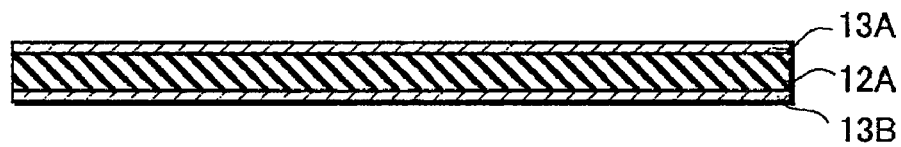

The laminated sheet 10 of this embodiment is next described with reference to FIG. 1A and FIG. 1B. The laminated sheet 10 comprises a first insulating film 12A used as a core, a first conductive film 13A and a second conductive film 13B attached to a front surface and a rear surface of the first insulating film 12A, respectively. A thermoplastic resin or a thermosetting resin can be used as the material for the first insulating layer 12A. An inorganic filler exhibiting heat conductance is mixed in the resin. The material employed in the first insulating layer 12A may include glass-cross or may include inorganic filler in the glass cross in order to improve overall strength. The thickness of the first insulating layer 12A can be around 50 μm.

Metal comprising mainly Cu can generally be used as material for the first and the second conductive films 13A and 13B, respectively. In this embodiment, rolled Cu foils can be employed as the material for the first and the second conductive films 13A and 13B, respectively. The thickness of the conductive foils can be around 10 μm. The conductive films can be directly deposited on the insulating film 12A by the plating method, evaporation method or sputtering and a metal foil formed by the rolling method or plating method can be attached thereto.

The laminated sheet 10 is next described in detail with reference to FIG. 1A. A plurality of units 11 which are regions constituting a multilayer substrate are formed in the laminated sheet 10. Here, the four units 11 aligned in a matrix are formed in the laminated sheet 10. These units 11 have a planarly rectangular shape in the figure, but the units 11 having other shapes can be formed.

Figure 1C:
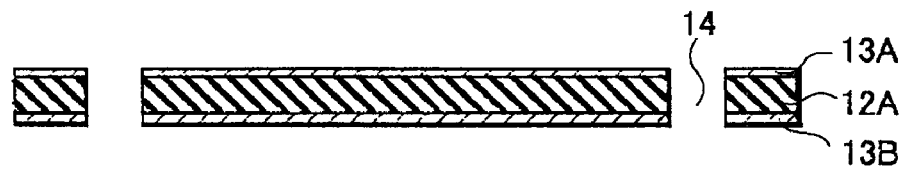

The positioning holes 14 are formed so as to penetrate the laminated sheet 10 as shown in FIG. 1C. The positioning holes 14 are positioning sections used for positioning during the process of patterning of a second film or any subsequent films.

Moreover, the positioning holes 14 are also used when forming the interconnecting portion 16 electrically interconnecting wiring layers 13. The positioning holes 14 can be formed by opening holes using a drill. After both conductive foils 13 at the area where the positioning holes 14 are formed are removed by etching, the exposed insulating film can be removed by laser. The diameter of the positioning holes 14 formed in this process can be of around 0.15 mm.

Next, a description is given of the locations where the positioning holes 14 are formed. Here, the positioning holes 14 are formed in the vicinity of outer sides of each unit. A plurality of the positioning holes 14 is provided with the each unit 11 to improve positioning accuracy. Here, 4 positioning holes 14 are provided in the vicinity of each corner of the units 11, but the number of the positioning holes 14 is arbitrary. For instance, there may be only 2 positioning holes 14 formed for the each unit 11. The number of the positioning holes 14 formed in the one laminated sheet 10 can be modified within a range from 2 to 100.

Figure 1D:
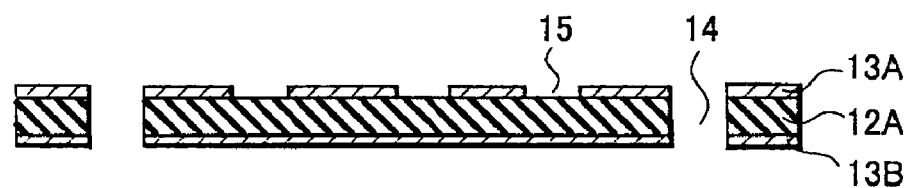

Exposed portions 15 exposing the insulating film 12A are formed by partially removing the first conductive film 13A, as shown in FIG. 1D. Here, the exposed portions 15 are formed inside the each unit 11. In the removal process, the outer shape of the positioning holes 14 provided for the each unit 11 is identified to thus identify the position of the central point. The advantage here is that, even if the size of the circular positioning holes differs, centers thereof always coincide.

Figure 1E:
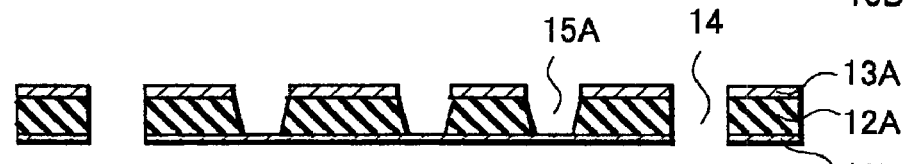

Through-holes 15 are formed by removing the first insulating film 12A exposed from the exposed portion 15, as illustrated in FIG. 1E. The first insulating film 12A can be removed by using a laser. The laser removing process is continued until a surface of the second conductive film 13B on the bottom of the through-holes 15 is exposed. Carbon dioxide laser is preferably used. In case residue is left on the bottom of the through-hole 15, it is removed by wet etching using sodium permanganate or ammonium persulfate, etc.

Figure 1F:
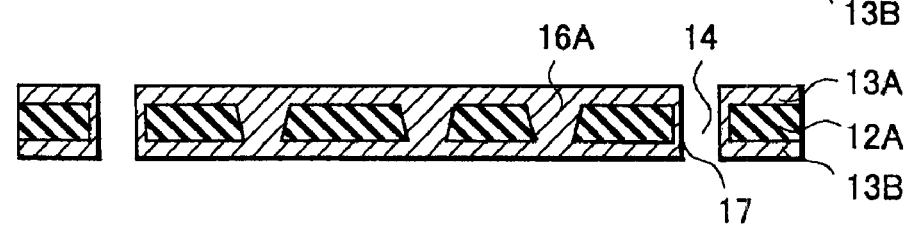

As shown in FIG. 1F, a first interconnecting portion 16A electrically connecting the first conductive film 13A and the second conductive film 13B is formed by the plating method. More concretely, a plated film is deposited on the entire first conductive film 13A including the through-holes 15 to thereby form the first connecting portion 16A. This plated film is deposited both by electroless plating and electrolysis plating. Here, the electroless plating is used to form a Cu plated film of about 2 μm on an entire first conductive film 13A including at least the through-holes 15. Since the first conductive film 13A and the second conductive film 13B are electrically coupled, these two conductive films are considered as electrodes and a further electrolytic plating method is carried out to form a plated film of Cu of around 20 μm. Accordingly, the through-holes 15 are filled with Cu to form interconnecting portions 15A. When filling plating is carried out, it is possible to selectively fill only the through-holes 15. Here, Cu is used for the plating film, but Au, Ag, Pd, etc. can be employed. A plating film can be formed only in the through-holes 15 by carrying out partial plating using a mask.

A metal film 17 comprising a plating film in the inner walls of the positioning holes 14 is formed in this process. The metal film 17 is formed of a film having an even thickness which is deposited on the inner walls of the positioning holes 14. Accordingly, by attaching the metal film 17, though the cross sectional area of the positioning holes 14 become small, the circular shape of the cross-section is kept.

FIG. 2 illustrate the process of laminating the conductive film 13 on the laminated sheet 10. FIG. 2A is a plain view of the laminated sheet 10 in this process and FIG. 2B to FIG. 2D are cross-sectional views of the laminated sheet 10 shown in each step of the process.

Figure 2A:
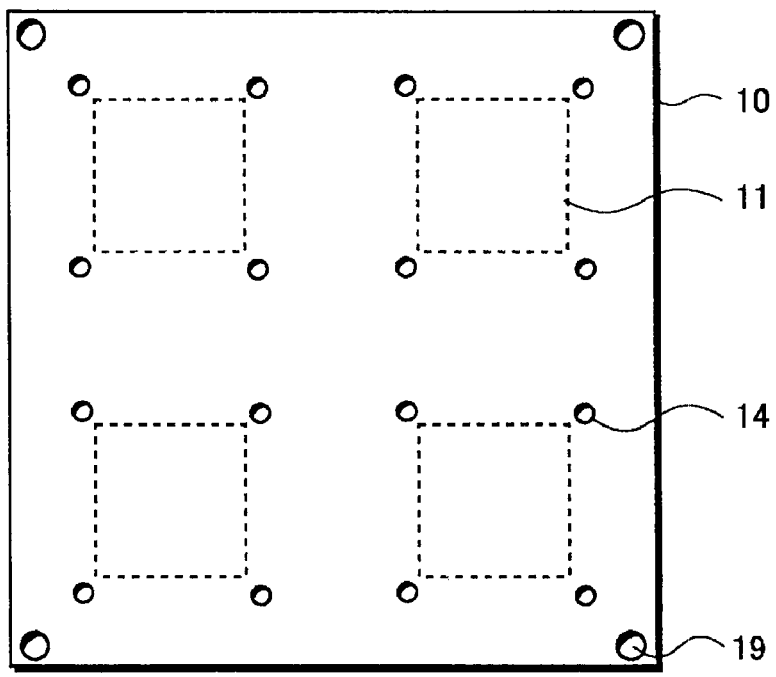
FIG. 2A is a planar view and FIG. 2B to FIG. 2D are cross-sectional views showing a manufacturing method of a multilayer substrate of the embodiments of the present invention.
Figure 2B:
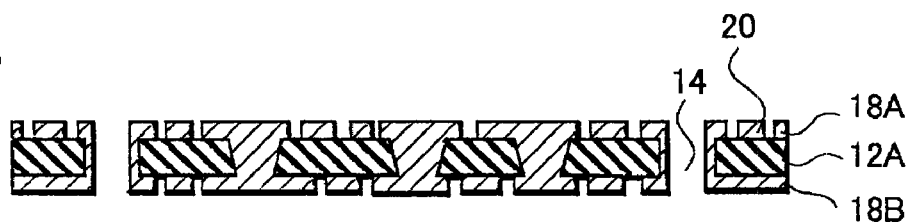

A first wiring layer 18A and a second wiring layer 18B are formed by etching the first and the second conductive film 13A and 13B, respectively, as illustrated in FIG. 2B. In this process, selective etching of each conductive film is carried out by using an etching resist. When exposing the etching resist, position of the positioning holes 14 is first identified and then relative positioning between the laminated sheet 10 and a photolithography mask is carried out. Even if the positioning hole 14 is small-sized, it is circular so that its central point coincides with the previous alignment. Alignment is carried out after identifying this central point to thus ensure accurate positioning.

In this process, an identification section 20 for identification by X-rays is also formed by etching. The identification section 20 can have any shape (rectangular, round, cross, etc.) which can be identified by an X-ray identification device. It can be located anywhere, but preferably it is located in the periphery of the unit.

Figure 2C:
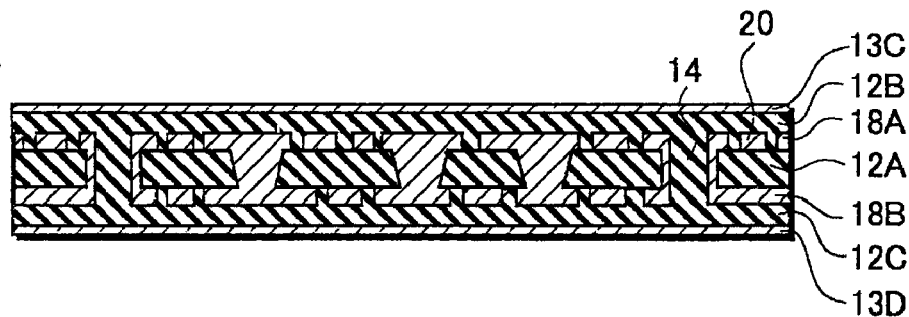

FIG. 2C illustrates a process of attaching a conductive film on both surfaces of the laminated sheet 10 via an insulating film. Concretely, a third conductive film 13C is laminated on a surface of the laminated sheet 10 via a second insulating film 12B. Next, a fourth conductive film 13D is laminated on a rear surface of the laminated sheet 10 via a third insulating film 12C. The conductive films 13 can be deposited by a vacuum press. In this process, resin is filled in the positioning holes 14 too and prepreg can be employed as the insulating film. The prepreg contains epoxy resin, etc. and fabric made of glass fabric, etc.

Figure 2D:
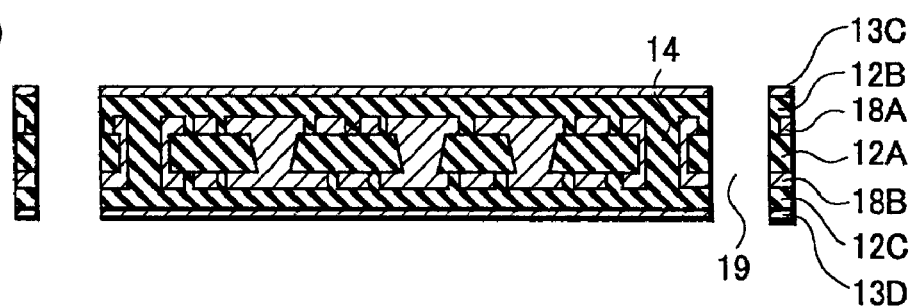

FIG. 2D shows a process of forming guide holes 19 which penetrate the laminated sheet 10. Concretely, the guide holes 19 are formed in four locations in the vicinity of the four corners of the laminated sheet 10 of FIG. 2A. The guide holes 19 can be formed by a process combining etching and laser or by using a drill. In order to determine the position of the guide holes 19, the position of the identification section 20 shown in FIG. 2C is first identified. The identification section 20 is provided at a location corresponding to the location where the guide hole 19 is formed. The identification section 20 comprises one part of the first wiring layer 18A. The diameter of the guide holes 19 ranges between some tens of microns to around 2 mm.

In this process, because the identification portion is covered by the third conductive film 13C, position thereof cannot be identified by visible light rays. Position of the identification section 20 is determined by irradiating with X-rays, etc., and the drill is positioned to form an opening. If outside dimensions of the laminated sheet 10 satisfy a predetermined accuracy, alignment in this process can also be carried out by using the outline of the laminated sheet as a reference.

As shown in FIG. 3, the positioning holes 14 for alignment are exposed. FIG. 3A is a plain view of the laminated sheet 10 of this process and FIG. 3B to FIG. 3D are cross-sectional views of the laminated sheet 10 in each step.

Figure 3A:
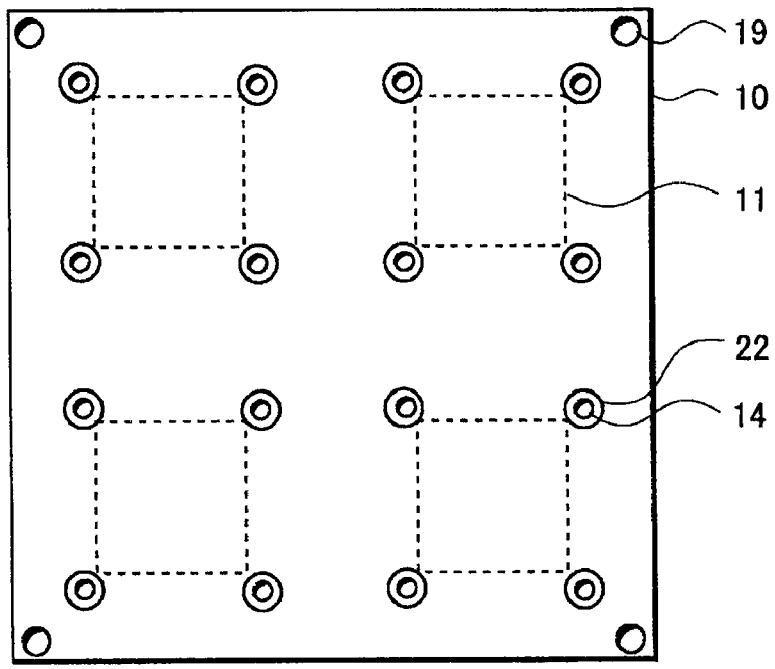
FIG. 3A is a planar view and FIG. 3B to FIG. 3D are cross-sectional views showing a manufacturing method of a multilayer substrate of the embodiments of the present invention.

An exposed portion 22 is formed by partially removing the third conductive film 13C after identifying the position of the circular guide holes 19, as shown in FIG. 3A. Concretely, the exposed portion 22 is formed by patterning an etching mask on a surface of the third conductive film 13C and then etching, using the position of the guide holes 19 as a reference. The same process is carried out with respect to the fourth conductive film 13D to form the exposed portion 22 on a rear surface of the laminated sheet 10.

The plain size of the exposed portion 22 is larger than the cross-section of the positioning holes 14. Concretely, a positioning hole 14 is 0.15 mm in diameter, whereas the plain size of the circular exposed portion 22 is about 1.5 mm. In this process, the exposed portion 22 is formed so that the periphery of the positioning holes 14 is exposed.

By forming the exposed portion 22 which is larger than the positioning holes 14, the positioning hole 14 can still be positioned inside the area where the exposed portion 22 is formed, even if position identification by the guide holes 19 is rough.

Figure 3B:
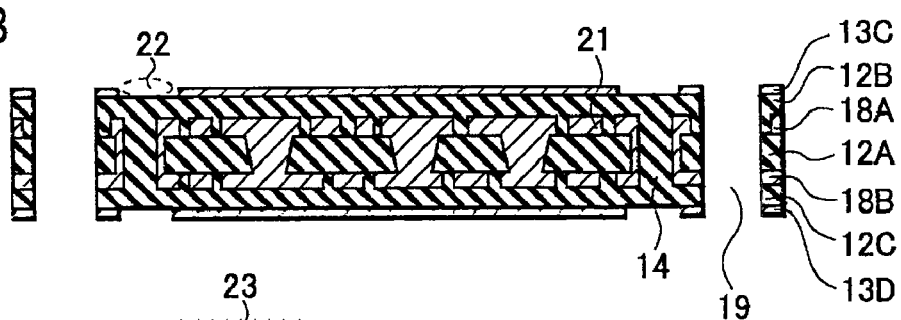

After determining the position of the identification section 20, the positioning holes 14 are exposed by use of a laser, as shown in FIG. 3B. Concretely, the position of the identification section 20 is first determined and after adjusting the relative position of the laser irradiator (not shown) and the positioning holes 14, laser is irradiated. Laser can be irradiated on only one surface of the laminated sheet 10 or it can also be irradiated on both surfaces of the laminated sheet 10. A protection portion 24 that continues with the positioning holes 14 has the shape of a sword guard.

Figure 3C:
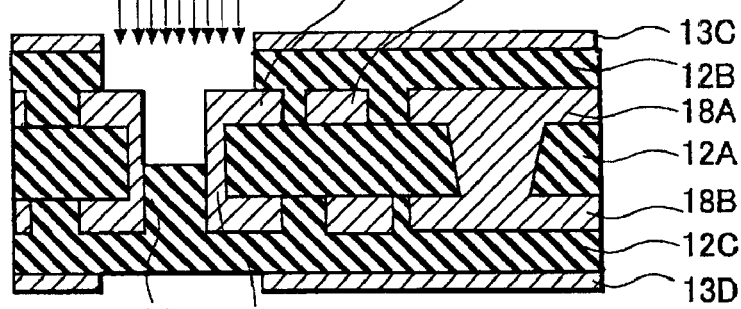

As shown in FIG. 3C, the protection portion 24 formed of conductive film is formed at the periphery of the positioning holes 14. Concretely, the protection portion 24 is formed by the plated film continuing with the metal film 17 attached to one side surface of the positioning holes 14. The protection portion 24 is made of metal so that it is not influenced when this area is irradiated with laser beams 23.

The laser beams 23 are irradiated onto an area larger than the area of the positioning holes 14. Damage caused by the laser 23 when irradiated onto the surface of the laminated sheet 10 at locations other than the areas where the positioning holes 14 are formed can be prevented.

Side walls of the positioning holes 14 are protected by the metal film 17 formed of a plated film. If the laser 23 is irradiated onto the inner walls of the positioning holes 14, it is reflected by the metal film 17, thereby preventing erosion of the inner walls of the positioning holes 14.

Figure 3D:
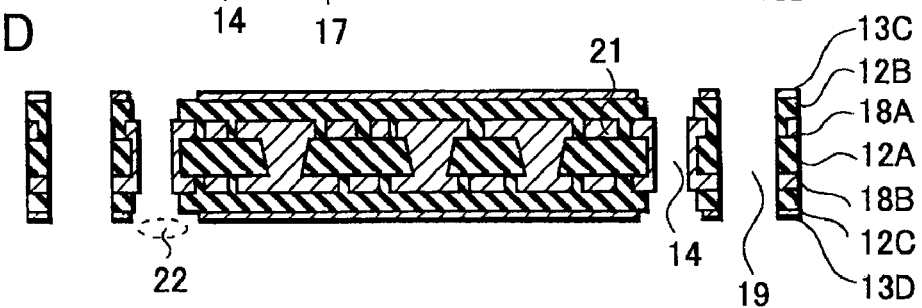

As illustrated in FIG. 3D, each positioning hole is exposed from the insulating film 12 by irradiation with the laser 23. The process of exposing the positioning holes 14 by laser is carried out with respect to each unit. Concretely, the positioning hole 14 is completely exposed but the third and the fourth conductive films 13C and 13D, respectively, are left on the surface of each unit.

As shown in FIG. 4 and FIG. 5, the new connecting portion 16 penetrating the insulating film 12 and the interconnecting wiring layers 18 is formed. Concretely, the third conductive film 13C and the second insulating film 12B at regions corresponding to a second connecting portion 16B to be formed are partly removed so that the second connecting portion 16B is formed by forming a plated film on the removed region. The second connecting portion 16B penetrating the third insulating film 12C is formed using the same method.

Figure 4A:
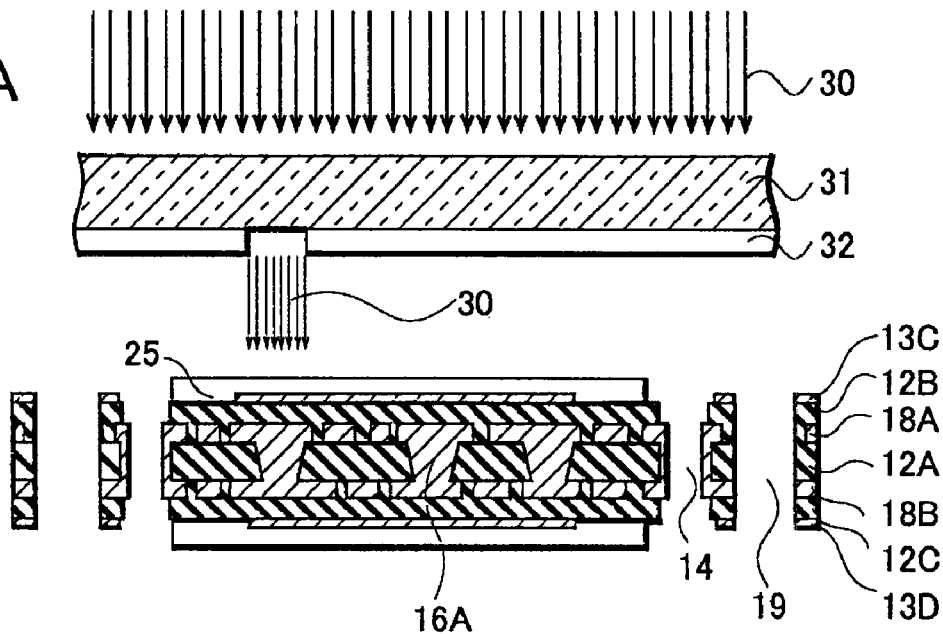
FIG. 4A and FIG. 4B are cross-sectional views and FIG. 4C is a schematic diagram showing a manufacturing method of a multilayer substrate of the embodiments of the present invention.

Concretely, a first etching resist 25 is applied so as to cover the third conductive film 13C, as shown in FIG. 4A and then, the resist 25 is exposed by using a photolithography mask 31. The photolithography mask 31 has a light-shielding pattern 32 on a surface of a transparent substrate such as glass, etc. The light-shielding pattern 32 has a shape which is inverse from the pattern shape of the second interconnecting portion 16B to be formed. The positive resist that remains at locations not irradiated with light rays 30 is used as the resist 25, but it is also possible to use a negative resist as the resist 25.

Figure 4B:
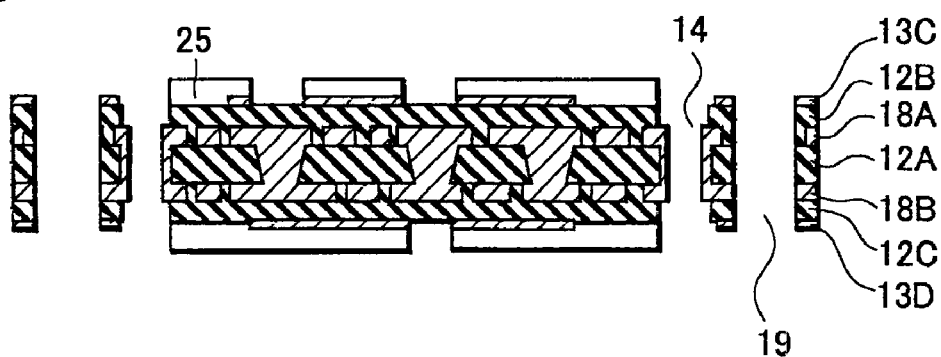

The third conductive film 13C corresponding to the region of the second interconnecting portion 16B is removed by carrying out etching via the resist 25 patterned in the above exposure process, as in FIG. 4B. The fourth conductive film 13D corresponding to the region of the second interconnecting portion 16B is also removed.

Figure 4C:
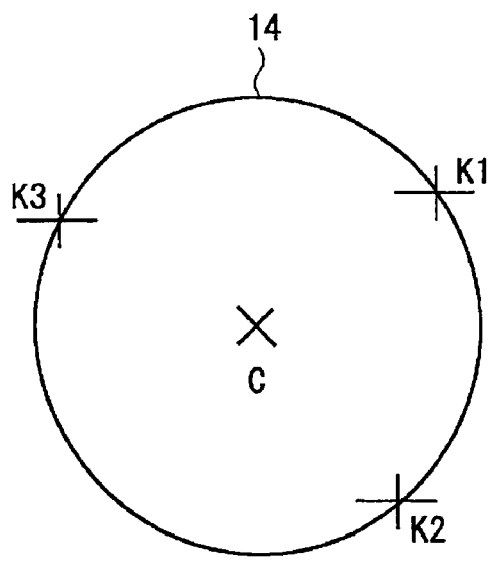

Next, alignment using the positioning holes 14 is described in detail with reference to FIG. 4C. In this embodiment, the central portion of the positioning holes 14 is used as reference when aligning the photolithography mask 31. Concretely, video equipment like a CCD camera, etc. is used to create an image of the positioning hole 14. The figure shows a cross-sectional image of the positioning hole 14 as developed by the video equipment. Three random points in the outer periphery of the positioning hole 14 are observed to identify position thereof. Here, a first set point K1, a second set point K2 and a third set point K3 are observed and planar coordinates thereof are identified. Then, coordinates of the center C of the positioning hole 14 can be calculated from the coordinate values of these points according to some geometry theorem. The positioning hole 14 has a planar circular shape so that calculation of the coordinates of the center C can be facilitated. Since this center C is used as a reference when aligning the photolithography mask 31, a photolithography process with a high-position accuracy can be carried out.

The center of the positioning hole 14 is also used as reference in the photolithography process to partially remove the fourth conductive film 13D. Accordingly, photolithography of the surface of the laminated sheet 10 and of the resist 25 coated on a rear surface thereof is carried out using the same positioning hole 14 so that accuracy of the relative position thereof can be improved.

Figure 5A:
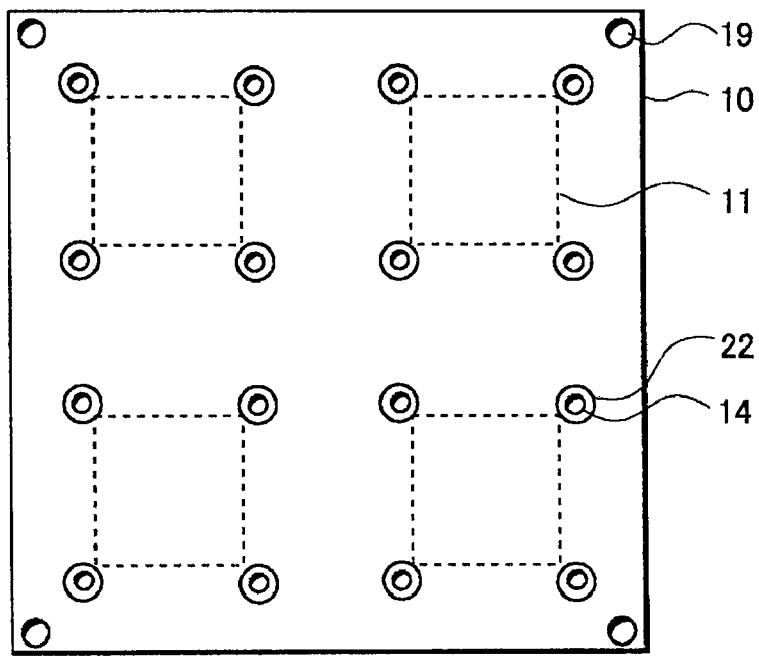
FIG. 5A is a planar view and FIG. 5B to FIG. 5C are cross-sectional views showing a manufacturing method of a multilayer substrate of the embodiments of the present invention.
Figure 5B:
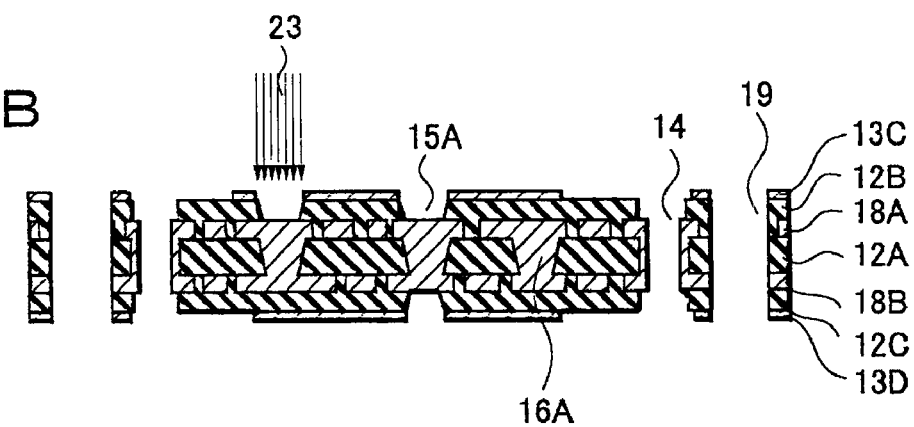
Figure 5C:
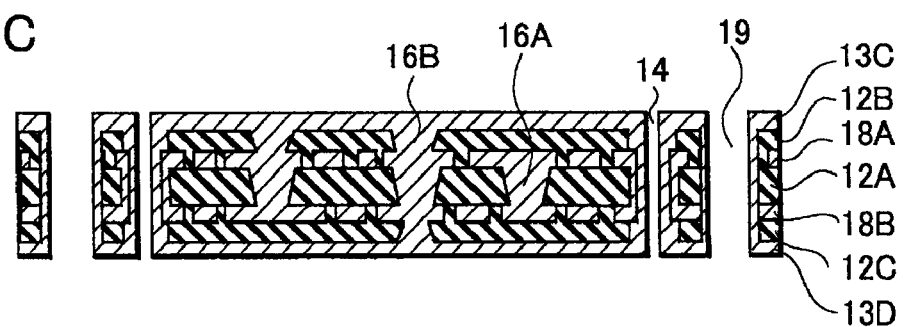

Next, the second insulating film 12B exposed from the third conductive film 13C is removed as shown in FIG. 5, and further, the third insulating film 12C exposed from the fourth conductive film 13D is partially removed. FIG. 5A is a planar view of the laminated sheet 10 whereas FIG. 5B and FIG. 5C are cross-sectional views of the laminated sheet 10.

In FIG. 5A, the positioning holes 14 are formed in the vicinity of the four corners of the each unit 11. The position of the interconnecting portion 16 formed for each unit is identified by using the positioning hole 14 formed in a vicinity thereof. The closer the positioning hole 14 and the unit 11, the more accurate the positioning.

The through-hole 15 is formed by irradiating with the laser 23 to cause partial laser vaporization of the second insulating film. The upper surface of the first wiring layer 18A is exposed from the bottom of the through-hole 15. Here, the center of the positioning hole 14 is used as reference when aligning the laser 23 and the laminated sheet 10. Accordingly, the accuracy of the relative positioning between the first wiring layer 18A and the through-hole 15 is very good.

Next, as described in FIG. 5C, the second interconnecting portion 16B formed of a plated film is provided in the through-hole 15 by an electroless plating method or an electrolytic plating method. The plating method of this embodiment is same as the method described with reference to FIG. 1F and a plated film is also formed on the inner walls of the positioning holes 14. By forming a plated film on inner walls of the circular positioning holes 14, cross section thereof becomes small but the circular cross section is still maintained. A plated film is also formed on inner walls of the guide holes 19.

Figure 6A:
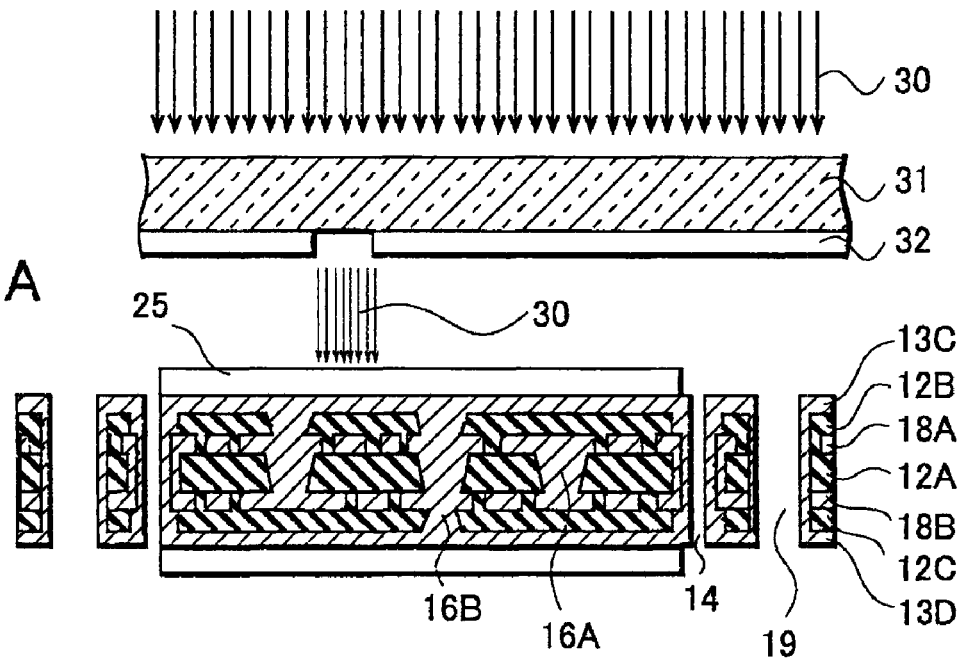
FIG. 6A is a cross-sectional view and FIG. 6B is a schematic diagram showing a manufacturing method of a multilayer substrate of the embodiments of the present invention.

The third conductive film 13C and the fourth conductive film 13D are then etched to form new patterns of the electrodes and wiring, as shown in FIG. 6A. Concretely, after the etching resist 25 is applied on a surface of the third conductive film 13C, the resist 25 is patterned by exposure using the photolithography mask 31. The third and the fourth conductive films 13C and 13D are etched via the resist 25 which was patterned. Alignment between the photolithography mask 31 and the laminated sheet 10 is carried out by identifying the center of the positioning hole 14.

Figure 6B:
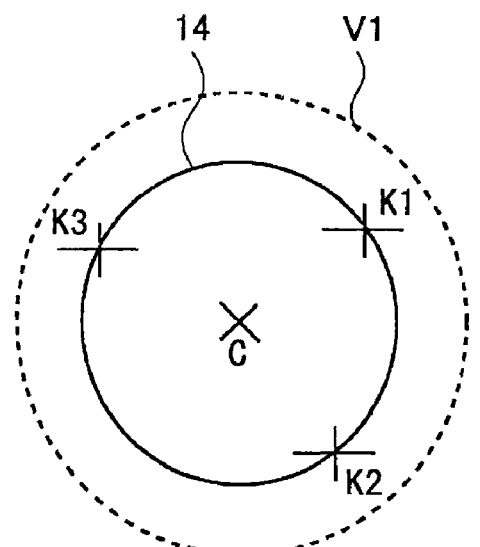

Identification method of the positioning hole 14 according to this embodiment, as shown in FIG. 6B, is basically the same as that described with reference to FIG. 4C. The cross-section of the positioning hole 14 becomes smaller because a plated film is formed on inner walls thereof. In FIG. 6B, the positioning hole 14 before having the plated film formed on inner walls thereof is shown by a dashed line V1, whereas the positioning hole 14 having the plated film formed therein is shown by a solid line. The plated film formed therein is a uniform film so that the circular shape of the positioning hole 14 is maintained even if its cross-sectional area is reduced. Three set points (first set point K1, second set point K2 and third set point K3) located in the periphery of the positioning hole 14 are observed to thus enable accurate measurement of the position of the center C.

Next, the surface of the laminated sheet 10 and the wiring layer 18 exposed from a rear surface thereof are covered by a solder resist as shown in FIG. 7. FIG. 7A is a planar view of the laminated sheet 10 and FIG. 7B to FIG. 7D are cross-sectional views of the laminated sheet 10.

Figure 7A:
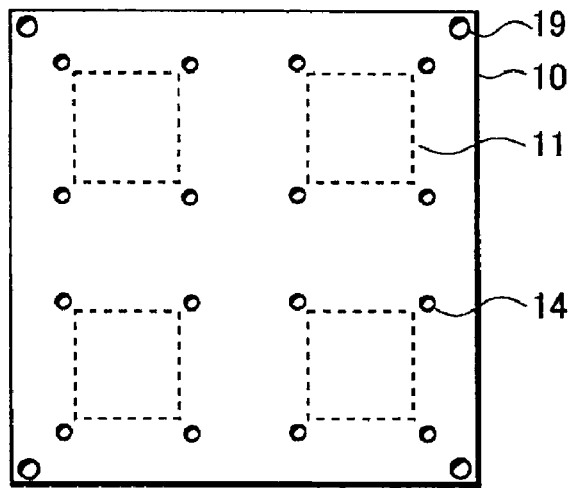
FIG. 7A is a planar view and FIG. 7B to FIG. 7D are cross-sectional views showing a manufacturing method of a multilayer substrate of the embodiments of the present invention.
Figure 7B:
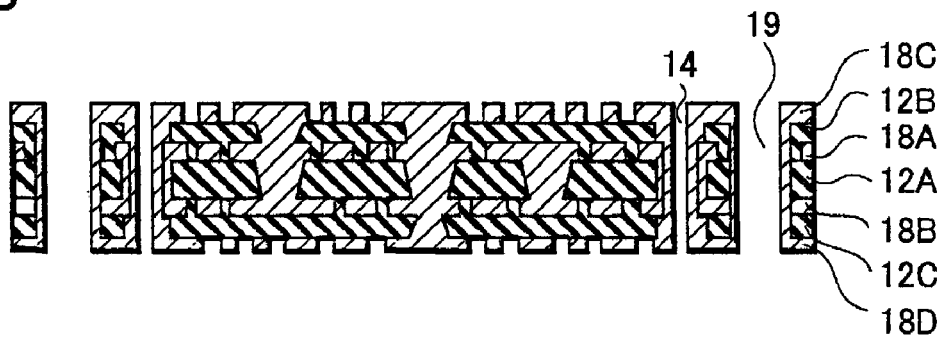
Figure 7C:
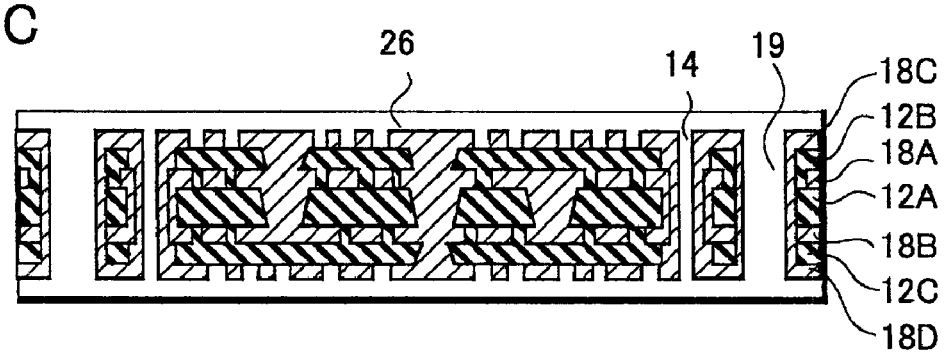

In the above process of etching, a third wiring layer 18C is formed on a surface of the laminated sheet 10 and a fourth wiring layer 18D is formed on a rear surface thereof, as shown in FIG. 7B.

A resist 26 is formed to cover the third wiring layer 18C and the fourth wiring layer 18D formed on a surface and a rear surface of the laminated sheet 10, respectively. The resin forming the resist 26 can also be filled inside the positioning hole 14 and the guide hole 19.

Figure 7D:
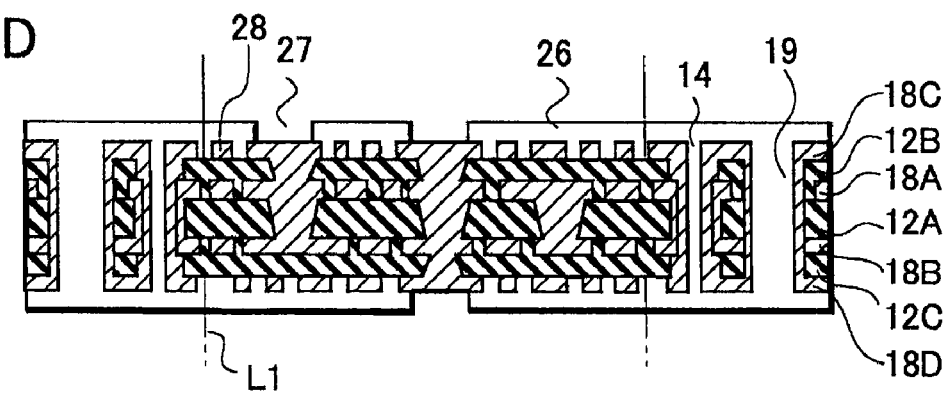

An opening 27 is formed in the resist 26 by laser evaporation or lithography, as illustrated in FIG. 7D. The opening 27 can be provided on both surfaces of the laminated sheet 10 or on a single surface only. The third wiring layer 18C or the fourth wiring layer 18D are exposed from the bottom of the opening 27. The opening 27 can be formed by identifying the position of an identification portion 28 comprising the third wiring layer 18C. Here, the opening 27 can be formed by using the position of the positioning hole 14 as reference.

After the above process is completed, the laminated sheet 10 is divided into the individual units 11 at the separation line L1 which is shown by a dashed line in FIG. 7D. The laminated sheet 10 is preferably cut by a laser at portions where the wiring layer 18 is not formed, so that vibration caused at the time of cutting can be suppressed to minimum. In the above process, a multilayer substrate having a multilayer wiring structure can be obtained. The individual units 11 can also be cut after the circuit element is attached on the laminated sheet via the opening 27. The cutting process can also be carried out by a process employing a router machine or a press.

Figure 8A:
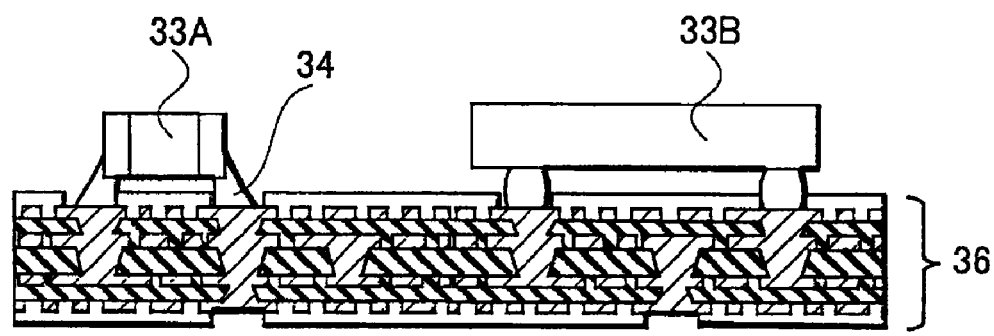
FIG. 8A and FIG. 8B are cross-sectional views describing a structure employing a multilayer substrate manufactured according to a manufacturing method of the embodiments of the present invention.

A mounting structure employing a multilayer substrate 36 manufactured according to the above manufacturing method is next described with reference to FIG. 8A. A circuit element 33B which is a semiconductor element is mounted on the surface of the multilayer substrate 36 via brazing material 34. The circuit element 33B is mounted face-down, but it is also possible to use an attached structure employing fine metal wiring. A circuit element 33A is preferably a passive element such as a chip resistor or a chip capacitor, etc. and is attached to the multilayer substrate 36 via the brazing material 34. If needed, leads or connectors functioning as connecting device with the exterior can also be mounted. When the semiconductor element is formed as a module substrate and has no case attached thereto, a packaged IC, CSP, etc. can be mounted thereon, whereas when it is cased, other elements such as bare chips can be mounted thereon.

Figure 8B:
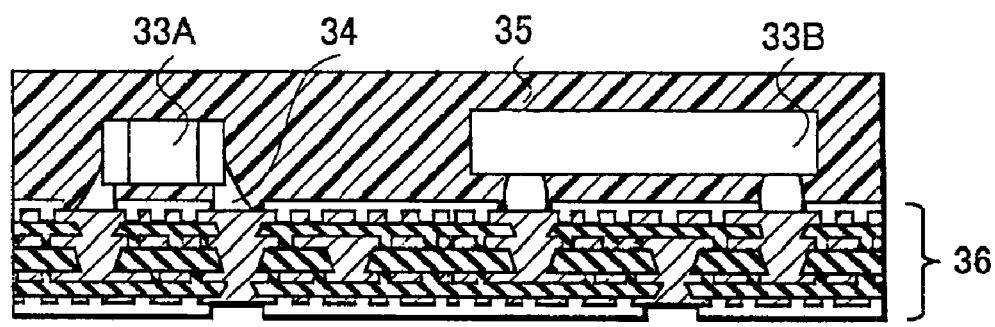
Figure 9A:
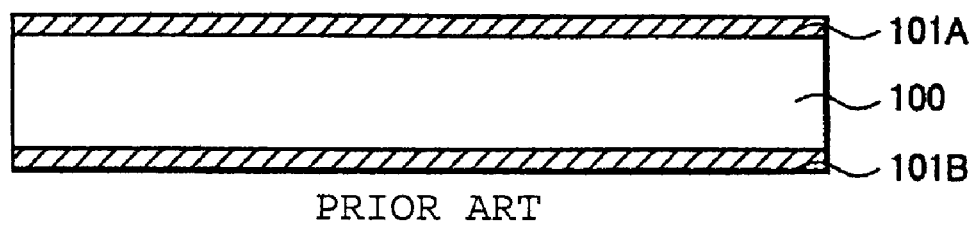
FIG. 9A to FIG. 9C are cross-sectional views showing a conventional manufacturing method of a multilayer substrate.
Figure 9B:
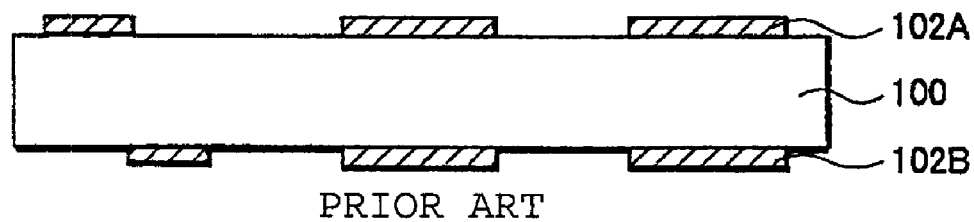
Figure 9C:
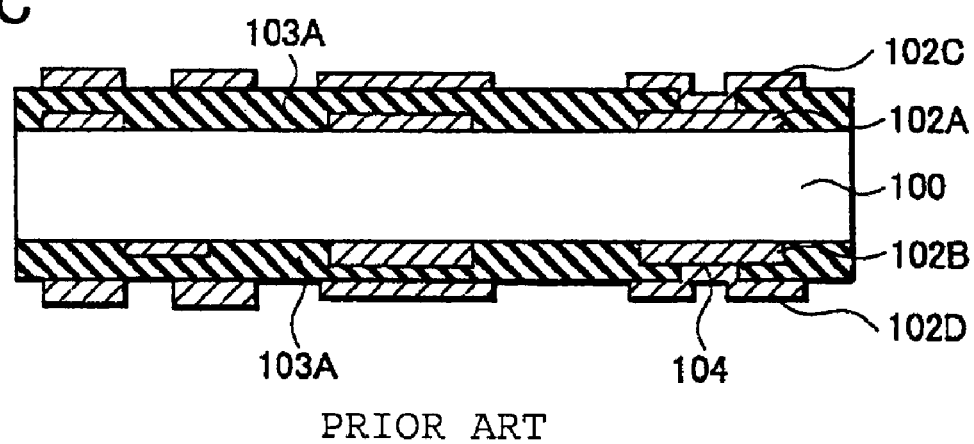

Next, a semiconductor package using a multilayer substrate is described with reference to FIG. 8B. Here, a circuit element 33 is mounted on the multilayer substrate 36 and a sealing resin 35 is formed on the surface of the multilayer substrate 36 so as to seal the circuit element 33. The multilayer substrate 36 here is a very thin substrate and by employing this thin substrate in a circuit device it is possible to obtain a low-profile circuit device. Recently, ICs tend to increase as 500 pins or as 1000 pins, and the size of the exterior electrodes also tend to be minute and have a narrow pinch. Accordingly, if the multilayer substrate is implemented, circuit modules, or the so-called SIPs using discrete elements, chip capacitors, chip resistors, etc. can be obtained.

What is claimed is:

1. A method of manufacturing a multilayer substrate, the method comprising:
preparing a laminated sheet including a resin core section having a first surface and a second surface, and a positioning section formed to penetrate through the core section from the first surface to the second surface of the core section;
coating an inner wall of the positioning section with a metal material;
laminating a conductive film on each of the first surface and the second surface of the laminated sheet via an insulating film;
removing the conductive film and the insulating film from a region corresponding to the positioning section to expose the inner wall of the positioning section;
determining position information about the inner wall of the positioning section and using the position information as reference information to determine a position of the conductive film; and
subsequently patterning the conductive film to form a wiring layer.

2. The method of claim 1, wherein patterning the conductive film includes patterning both of the conductive film laminated on the first surface of the laminated sheet and the conductive film laminated on the second surface of the laminated sheet.

3. The method of claim 1, wherein patterning the conductive film includes using the position of the inner wall of the positioning section as a reference.

4. The method of claim 1, wherein patterning the conductive film includes patterning a resist using an exposure mask, and etching the conductive film via the patterned resist, wherein the positioning section is used as a reference for positioning the exposure mask.

5. The method of claim 4, wherein determining the position information includes identifying a plurality of points of the inner wall of the positioning section, assuming a cross-section of the positioning section to be circular, and calculating a position of a center point of the positioning section based on the positions of the plurality of points, and positioning the exposure mask includes using the position of the center point as a reference.

6. The method of claim 1, wherein determining the position information includes identifying a plurality of points of the inner wall of the positioning section, assuming a cross-section of the positioning section to be circular, and calculating a position of a center point of the positioning section based on the positions of the plurality of points, and patterning the conductive film includes using the position of the center point as a reference.

7. The method of claim 1, wherein removing the conductive film and the insulating film includes providing an exposed portion by removing the conductive film in a region overlapping the positioning section and irradiating laser light onto the insulating film through the exposed portion to expose the inner wall of the positioning section.

8. The method of claim 1, further comprising coating a periphery of the positioning section in each of the first surface and second surface of the core section with a protection portion made of a metal material, and wherein a laser is irradiated onto the insulating film filled in the positioning section and onto the protection portion to expose the inner wall of the positioning section.

9. A method of manufacturing a multilayer substrate, the method comprising:
preparing a laminated sheet including a first insulating film having a first surface and a second surface each made of a resin, a first wiring layer formed on the first surface of the first insulating film, a second wiring layer formed on the second surface of the first insulating film, and a positioning section formed to penetrate the first insulating film from the first surface to the second surface of the first insulating film, and the positioning section having an inner wall coated with a metal material;

laminating a first conductive film on the first surface of the first insulating film via a second insulating film, laminating a second conductive film on the second surface of the first insulating film via a third insulating film;

exposing the inner wall of the positioning section by removing the first and second conductive films in respective regions overlapping the positioning section, and by removing a resin material filled in the positioning section;

forming a third wiring layer by patterning the first conductive film by using a position of the inner wall of the positioning section as a reference; and forming a fourth wiring layer by patterning the second conductive film by using the position of the inner wall of the positioning section as a reference.

10. The method of claim 9, wherein removing the resin material includes irradiating laser light on the resin material.

11. The method of claim 9, wherein forming the third wiring layer includes applying a resist to the first conductive film, patterning the resist with an exposure mask by using the positioning section as a reference to position the exposure mask, and etching the first conductive film through the patterned resist.

12. The method of claim 11, wherein using the positioning section as a reference includes identifying positions of a plurality of points of the inner wall of the positioning section, assuming the shape of the position section to be circular in a plan view, and calculating a position of a center point of the positioning section based on the positions of the plurality of points, and wherein positioning the exposure mask uses the position of the center point as a reference.

13. The method of claim 9, wherein forming the fourth wiring layer includes applying a resist to the second conductive film, patterning the resist with an exposure mask by using the positioning section as a reference to position the exposure mask, and etching the second conductive film through the resist.

14. The method of claim 13, wherein using the positioning section as a reference includes identifying positions of a plurality of points of the inner wall of the positioning section, assuming the shape if the position section to be circular in a plan view, and calculating a position of a center point of the positioning section based on the positions of the plurality of points, and wherein positioning the exposure mask uses the position of the center point as a reference.

15. The method of claim 9, further comprising coating a periphery of the positioning section in each of the first surface and second surface of the first insulating film with a protection portion made of a metal material, and wherein exposing the inner wall of the positioning section includes irradiating a laser onto the resin material filled in the positioning section and onto the protection portion.

* * * * *